(12) United States Patent
Wu et al.

(10) Patent No.: US 9,704,790 B1
(45) Date of Patent: Jul. 11, 2017

(54) METHOD OF FABRICATING A WAFER LEVEL PACKAGE

(71) Applicant: Micron Technology, Inc., Boise, ID (US)

(72) Inventors: Tieh-Chiang Wu, Taoyuan (TW); Shing-Yih Shih, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/069,911

(22) Filed: Mar. 14, 2016

(51) Int. Cl.
| | |
|---|---|
| *H01L 21/44* | (2006.01) |
| *H01L 23/12* | (2006.01) |
| *H01L 23/498* | (2006.01) |
| *H01L 23/31* | (2006.01) |
| *H01L 21/56* | (2006.01) |
| *H01L 21/50* | (2006.01) |
| *H01L 21/78* | (2006.01) |
| *H01L 23/00* | (2006.01) |
| *H01L 21/60* | (2006.01) |

(52) U.S. Cl.
CPC ........ *H01L 23/49805* (2013.01); *H01L 21/50* (2013.01); *H01L 21/561* (2013.01); *H01L 21/563* (2013.01); *H01L 21/565* (2013.01); *H01L 21/78* (2013.01); *H01L 23/3185* (2013.01); *H01L 23/49822* (2013.01); *H01L 23/49827* (2013.01); *H01L 24/19* (2013.01); *H01L 2021/60255* (2013.01)

(58) Field of Classification Search
CPC ............... H01L 21/565; H01L 23/3185; H01L 23/49822; H01L 21/78; H01L 23/49827; H01L 21/561; H01L 21/563; H01L 23/49805; H01L 21/50; H01L 24/19
See application file for complete search history.

(56) References Cited

U.S. PATENT DOCUMENTS

| | | | | |
|---|---|---|---|---|
| 6,271,469 | B1 | 8/2001 | Ma | |
| 8,320,134 | B2 * | 11/2012 | Su | .............. H01L 23/49827 174/262 |
| 9,449,935 | B1 * | 9/2016 | Shih | .................. H01L 24/17 |
| 9,449,953 | B1 * | 9/2016 | Shih | .............. H01L 25/0655 |
| 9,520,333 | B1 * | 12/2016 | Shih | .............. H01L 23/3171 |

(Continued)

FOREIGN PATENT DOCUMENTS

| | | |
|---|---|---|
| TW | 200917441 | 4/2009 |
| TW | 201533862 A | 9/2015 |

*Primary Examiner* — Alonzo Chambliss
(74) *Attorney, Agent, or Firm* — TraskBritt

(57) ABSTRACT

A semiconductor package includes a redistribution layer (RDL) interposer having a first side, a second side, opposite to the first side. The RDL interposer comprises a first passivation layer, at least one dielectric layer on the first passivation layer, a metal layer in the at least one dielectric layer, a second passivation layer on the at least one dielectric layer, and a plurality of ball pads in the first passivation layer. At least one semiconductor die is mounted on the first side of the RDL interposer. A solder mask covers a lower surface of the first passivation layer and exposes the plurality of ball pads through a plurality of openings in the solder mask. An under-bump mettalization (UBM) layer is disposed at a bottom of each of the plurality of openings. A solder bump or solder ball is disposed on the UBM layer in each of the plurality of openings.

9 Claims, 11 Drawing Sheets

(56) References Cited

U.S. PATENT DOCUMENTS

| | | | |
|---|---|---|---|
| 2009/0140442 A1* | 6/2009 | Lin | H01L 21/565 257/778 |
| 2011/0254156 A1* | 10/2011 | Lin | H01L 21/566 257/737 |
| 2013/0087909 A1 | 4/2013 | Abdul Razak | |
| 2016/0358865 A1* | 12/2016 | Shih | H01L 23/564 |
| 2016/0365334 A1* | 12/2016 | Shih | H01L 25/0657 |
| 2016/0372395 A1* | 12/2016 | Shih | H01L 23/3171 |

* cited by examiner

METHOD OF FABRICATING A WAFER LEVEL PACKAGE

BACKGROUND OF THE INVENTION

1. Field of the Invention

The present invention relates generally to the field of semiconductor packaging. More particularly, the present invention relates to a wafer level package and a method for manufacturing the same.

2. Description of the Prior Art

Semiconductor technologies are developing very fast, and especially semiconductor dies that require a tendency toward miniaturization. However, the requirements for the functions of the semiconductor dies preclude variety. Namely, the semiconductor dies must have more I/O pads in a smaller area, so the density of the pins is raised quickly. It causes the packaging for the semiconductor dies to become more difficult.

As known in the art, the process of wafer level packaging (WLP) packages the dies on a wafer before dividing the dies into respective dies. The WLP technology has some advantages, such as a shorter production cycle time and lower cost. Fan-out wafer-level packaging (FOWLP) is a packaging process in which contacts of a semiconductor die are redistributed over a larger area through a redistribution layer (RDL) that is typically formed on a substrate, such as a TSV interposer.

The RDL is typically defined by the addition of metal and dielectric layers onto the surface of the wafer to re-route the I/O layout into a looser pitch footprint. Such redistribution requires thin film polymers such as benzocyclobutene (BCB), polyimide (PI) or other organic polymers and metallization such as Al or Cu to reroute the peripheral pads to an area array configuration.

In wafer level packaging, the wafer and the dies mounted on the wafer are typically covered with a relatively thick layer of molding compound. Current fabrication process of the wafer level packaging includes thermal processes after molding. However, these post-molding thermal processes may increase the risk of known-good-die loss.

SUMMARY OF THE INVENTION

The present invention is directed to provide an improved semiconductor package in order to solve the above-mentioned prior art shortcomings.

According to one aspect of the invention, a semiconductor package includes a redistribution layer (RDL) interposer having a first side, a second side, opposite to the first side. The RDL interposer comprises a first passivation layer, at least one dielectric layer on the first passivation layer, a metal layer in the dielectric layer, a second passivation layer on the dielectric layer, and a plurality of ball pads in the first passivation layer. At least one semiconductor die is mounted on the first side of the RDL interposer. A molding compound is applied to surround the at least one semiconductor die on the first side of the RDL interposer. A solder mask covers a lower surface of the first passivation layer and exposes the plurality of ball pads through a plurality of openings in the solder mask. An under-bump metallization (UBM) layer is disposed at a bottom of each of the plurality of openings. A solder bump or solder ball is disposed on the UBM layer in each of the plurality of openings.

According to one aspect of the invention, a method for fabricating a semiconductor package is disclosed. First, a carrier having thereon a metal layer is provided. A first passivation layer is formed on the metal layer. A redistribution layer (RDL) is then formed on the first passivation layer and ball pads in the first passivation layer. A second passivation layer is formed on the RDL layer. At least one semiconductor die is then mounted on the second passivation layer. The semiconductor die is molded with a molding compound. The carrier is removed to expose a lower surface of the metal layer. The metal layer is patterned into an under-bump metallization (UBM) layer on each of the ball pads. A solder mask is formed on the first passivation layer. Solder bumps or solder balls are formed on the ball pads.

These and other objectives of the present invention will no doubt become obvious to those of ordinary skill in the art after reading the following detailed description of the preferred embodiment that is illustrated in the various drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
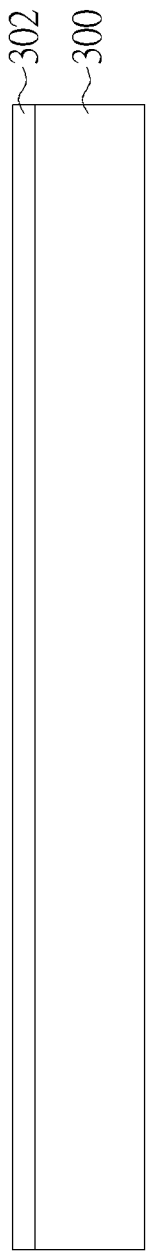
FIG. 1 to FIG. 11 are schematic diagrams showing an exemplary method for fabricating a semiconductor package according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the accompanying drawings, wherein like reference numerals are used to refer to like elements throughout, and wherein the illustrated structures are not necessarily drawn to scale. The terms "die," "semiconductor chip," and "semiconductor die" are used interchangeably throughout the specification.

The terms "wafer" and "substrate" used herein include any structure having an exposed surface onto which a layer is deposited according to the present invention, for example, to form the circuit structure such as a redistribution layer (RDL). The term "substrate" is understood to include semiconductor wafers, but is not limited thereto. The term "substrate" is also used to refer to semiconductor structures during processing, and may include other layers that have been fabricated thereupon.

Please refer to FIG. 1 to FIG. 11. FIG. 1 to FIG. 11 are schematic diagrams showing an exemplary method for fabricating a semiconductor package according to one embodiment of the invention.

As shown in FIG. 1, a carrier 300 is prepared. The carrier 300 may be a releasable wafer-shaped substrate with an adhesive layer (not explicitly shown). For example, the carrier 300 may be a glass substrate, but is not limited thereto. A metal layer 302 is then formed on a top surface of the carrier 300. The metal layer 302 may comprise an under-bump metallization (UBM) metal or metal alloy layer including, but is not limited to, nickel, gold, copper, or the like. The metal layer 302 may be adhered to the top surface of the carrier 300 through the adhesive layer (not explicitly shown) or may be directly coated onto the top surface of the carrier 300 without using an adhesive layer in some embodiments.

Figure 2:
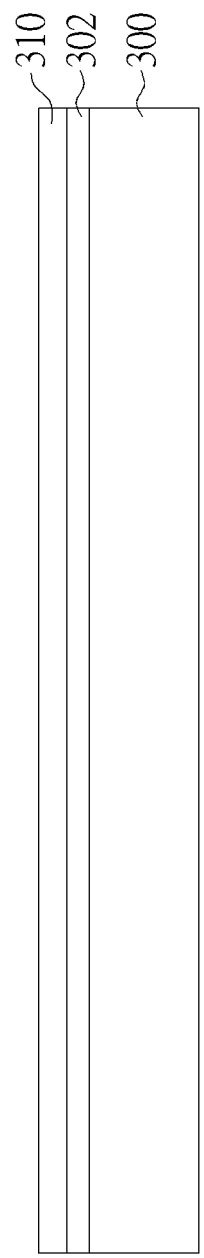

As shown in FIG. 2, at least a dielectric layer or a passivation layer 310 is then formed on the top surface of the carrier 300. The passivation layer 310 may comprise organic materials such as polyimide (PI) or inorganic materials such as silicon nitride, silicon oxide or the like.

Figure 3:
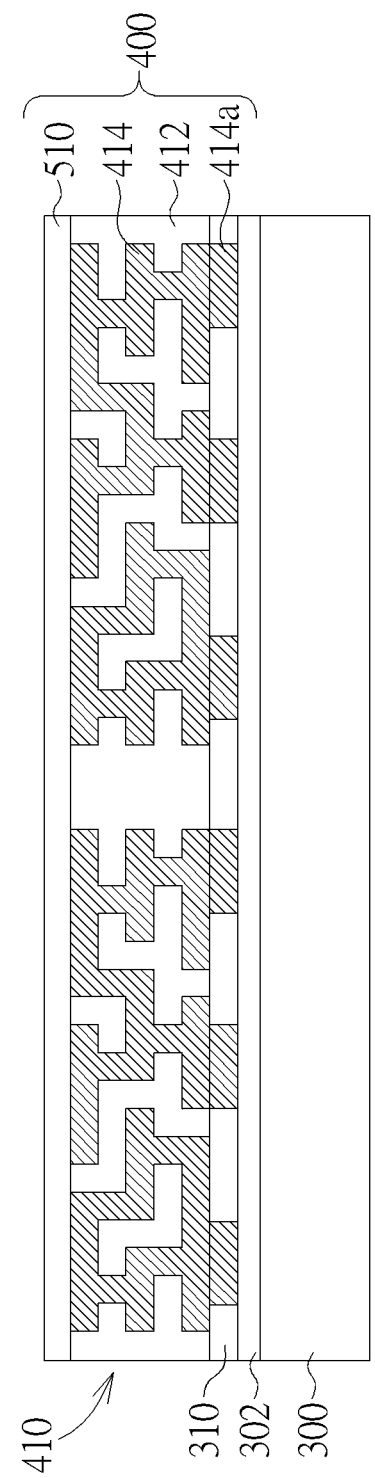

Subsequently, as shown in FIG. 3, a redistribution layer (RDL) layer 410 is formed on the passivation layer 310. The RDL layer 410 may comprise at least one dielectric layer 412 and at least one metal layer 414. The dielectric layer 412 may comprise organic materials such as polyimide (PI) or inorganic materials such as silicon nitride, silicon oxide or the like, but is not limited thereto. The metal layer 414 may comprise aluminum, copper, tungsten, titanium, titanium nitride, or the like.

According to the illustrated embodiment, the metal layer 414 may comprise a plurality of ball pads 414a (e.g., copper pads) in the passivation layer 310. A passivation layer (or a dielectric layer) 510 is formed on the RDL layer 410. The passivation layer 510 may comprise organic materials such as polyimide (PI) or inorganic materials such as silicon nitride, silicon oxide or the like. It is understood that the passivation layer 510 may comprise a solder mask, but is not limited thereto.

Figure 4:
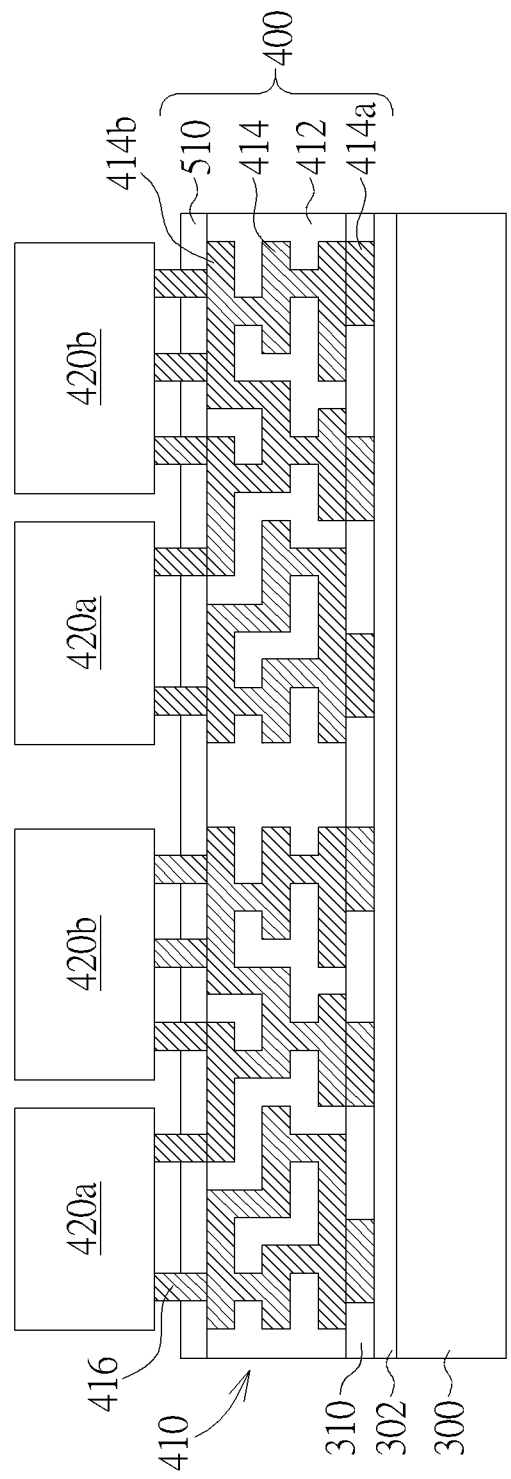

As shown in FIG. 4, a plurality of bumps 416, such as micro-bumps may be formed on the RDL layer 410 and in the passivation layer 510 for further connections. The bumps 416 may be directly formed on respective bump pads 414b in the metal layer 414. The formation of the bumps 416 is known in the art and the details thereof are omitted. Hereinafter, the passivation layer 310, the RDL layer 410, and the passivation layer 510 are collectively referred to as an RDL interposer 400.

After the formation of the bumps 416, individual flip-chips or dies 420a and 420b with their active sides facing down toward the RDL interposer 400 are then mounted on the RDL interposer 400 through the bumps 416 to form a stacked chip-to-wafer (C2W) construction. These individual flip-chips or dies 420a and 420b are active integrated circuit chips with certain functions, for example, GPU (graphics processing unit), CPU (central processing unit), memory chips, etc. According to the embodiment, the die 420a and the die 420b may be together disposed in one package and may be different chips with their specific functions. Optionally, an underfill (not shown) may be applied under each die 420a or 420b. Optionally, a thermal process may be performed to reflow the bumps 416.

Figure 5:
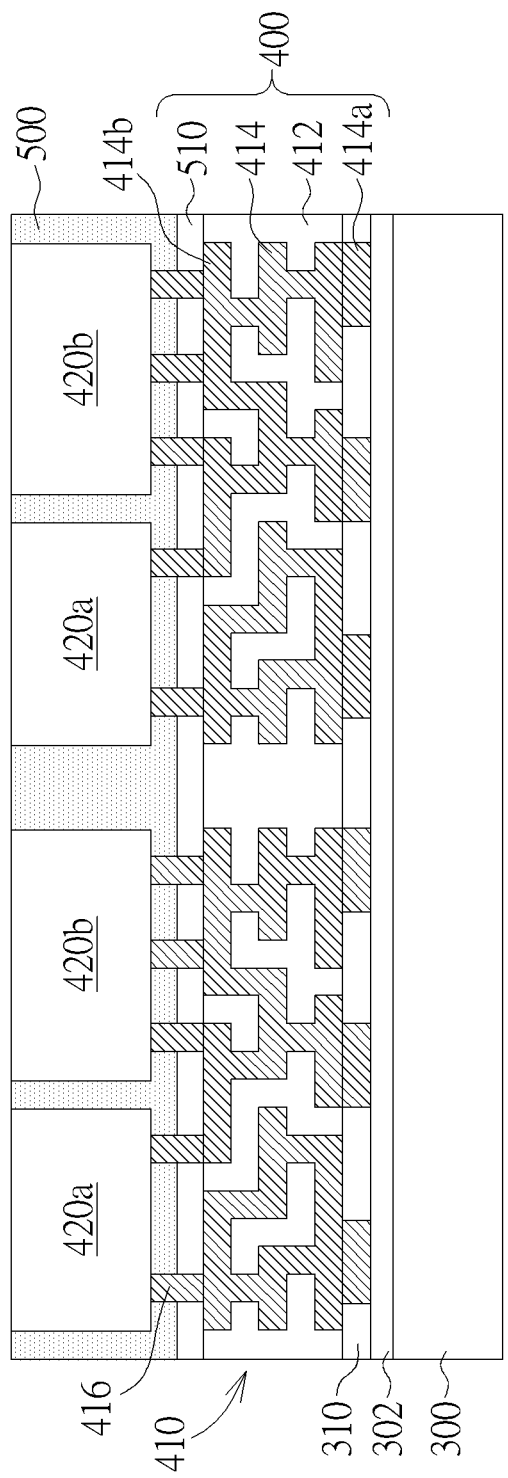

As shown in FIG. 5, a molding compound 500 is applied. The molding compound 500 covers the attached dies 420a and dies 420b, and a top surface of the passivation layer 510. Subsequently, the molding compound 500 may be subjected to a curing process. According to the embodiment, the mold compound 500 may comprise a mixture of epoxy and silica fillers, but is not limited thereto. Optionally, an upper portion of the molding compound 500 may be polished away.

Figure 6:
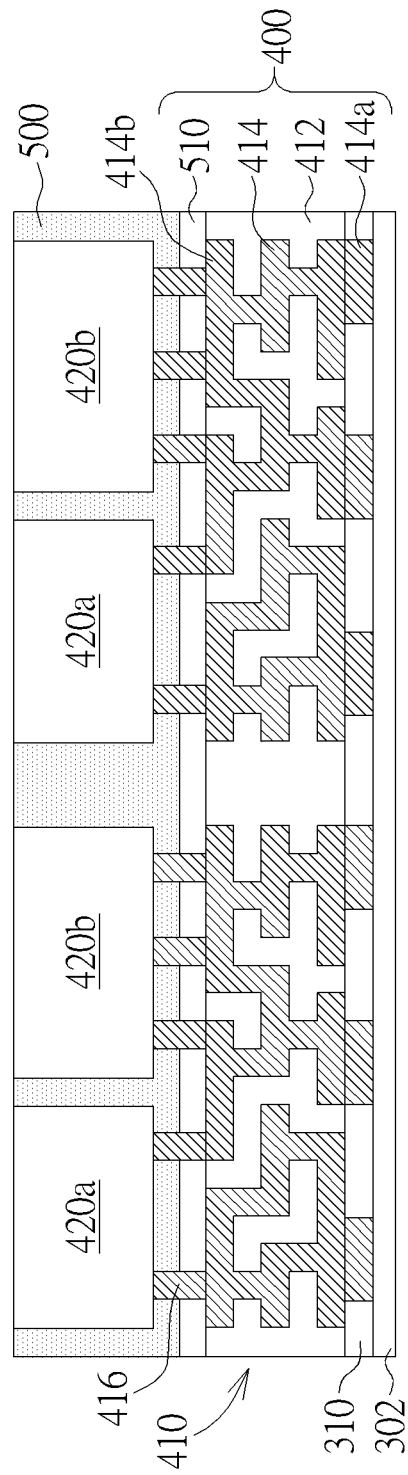

As shown in FIG. 6, the carrier 300 is removed or peeled off to expose a lower surface of the metal layer 310. The debonding of the carrier 300 may be performed by using a laser process or UV irradiation process, but is not limited thereto.

Figure 7:
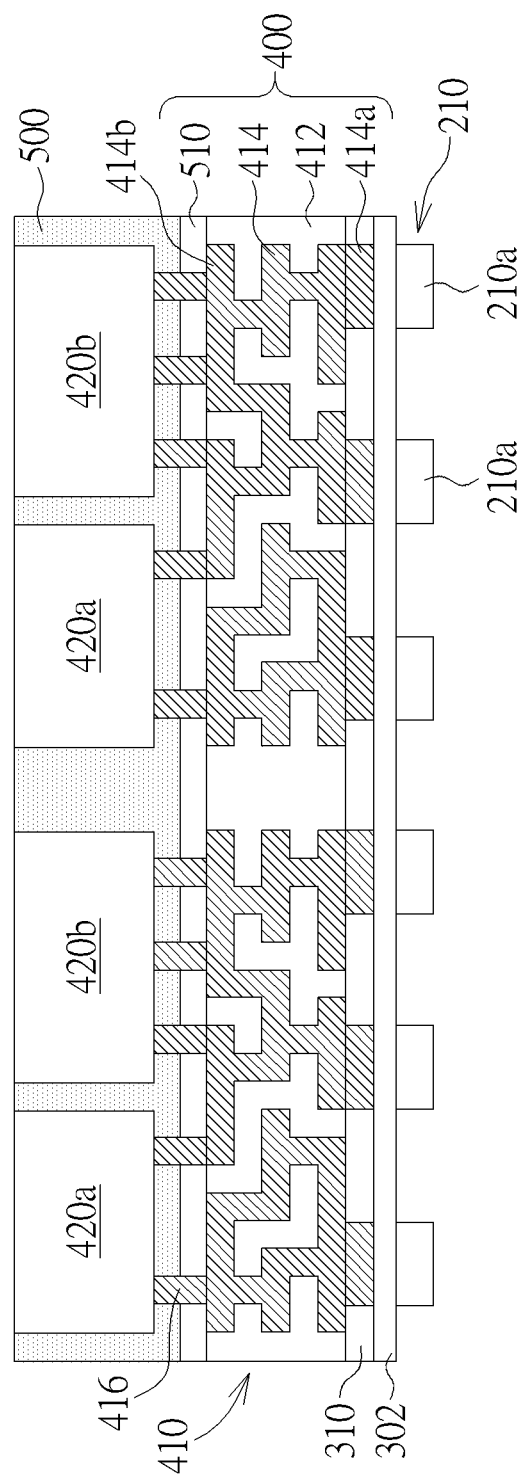

As shown in FIG. 7, after removing the carrier 300, a lithographic process is performed to form a photoresist layer 210 on an exposed lower surface of the metal layer 310. The photoresist layer 210 includes pad patterns 210a that are situated on and aligned with the respective ball pads 414a.

Figure 8:
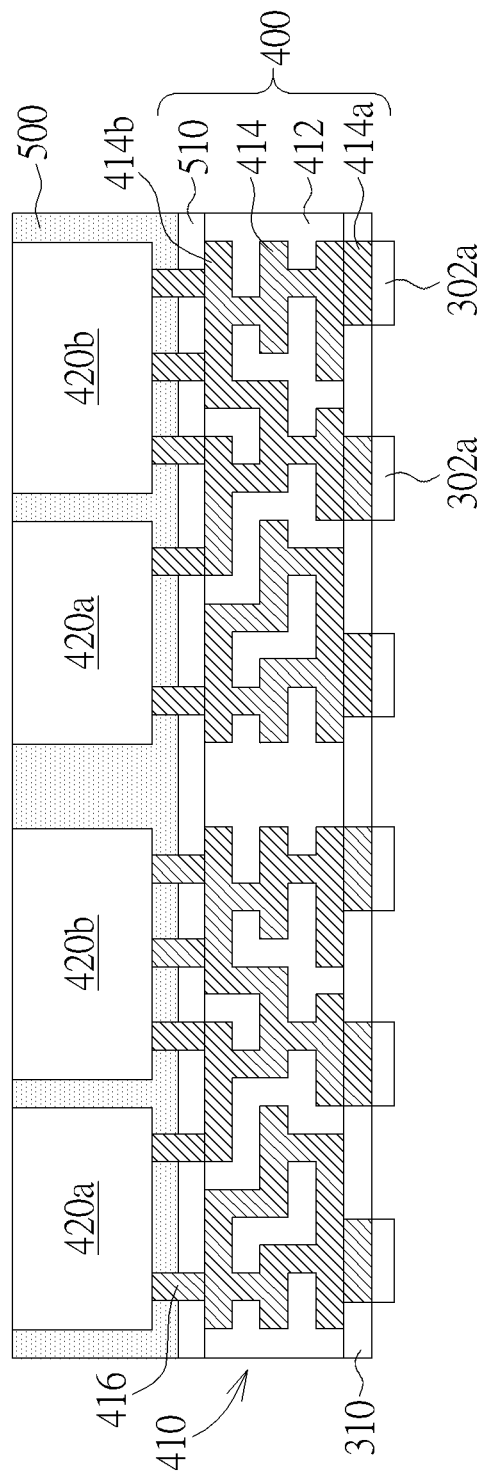

As shown in FIG. 8, an etching process is then performed to etch the metal layer 310 that is not covered by the pad patterns 210a to form a UBM layer 302a on each ball pad 414a. Subsequently, the photoresist layer 210 is removed.

Figure 9:
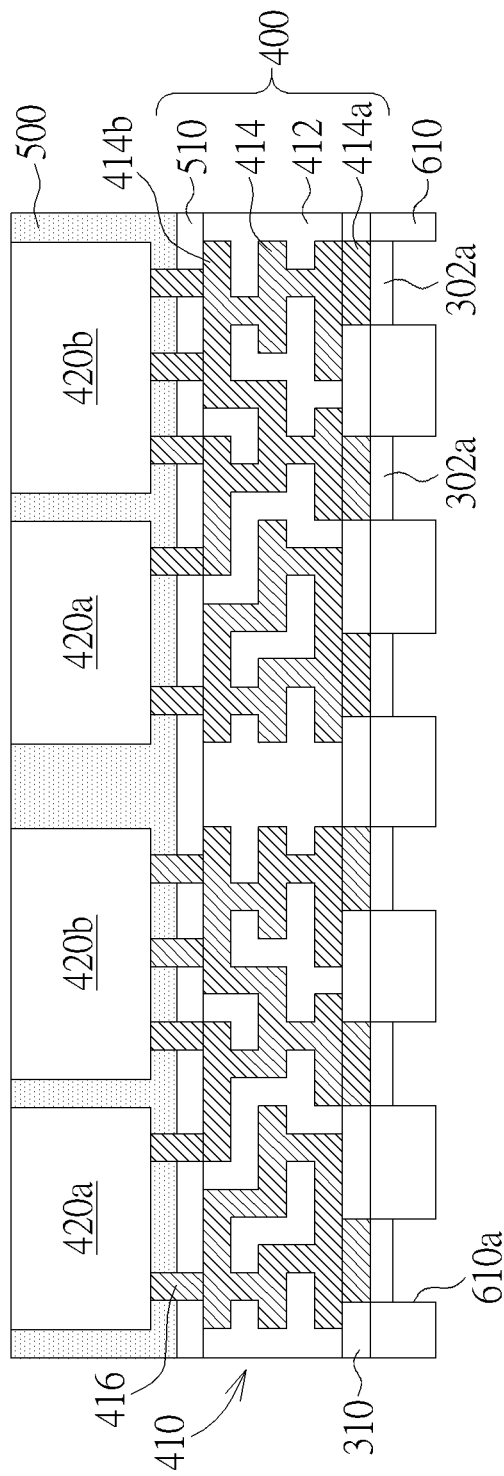

As shown in FIG. 9, after forming the UBM layer 302a on each ball pad 414a, a solder mask 610 is formed on the UBM layer 302a and the exposed lower surface of the passivation layer 310. A lithographic process is then performed to form openings 610a in the solder mask 610 to expose the UBM layer 302a.

Figure 10:
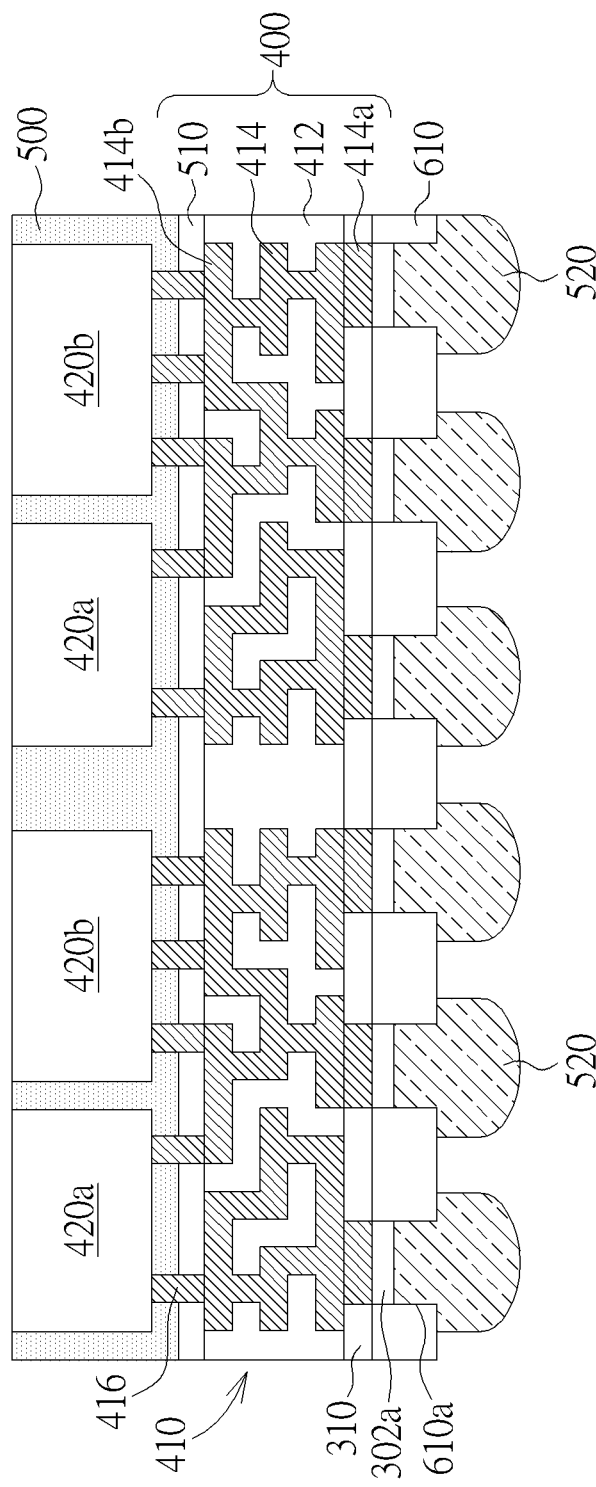

As shown in FIG. 10, after forming the solder mask 610 and the openings 610a in the solder mask 610, solder bumps or solder balls 520 may be disposed on the respective ball pads 414a. Each of the solder bumps or solder balls 520 is in direct contact with the UBM layer 302a.

Figure 11:
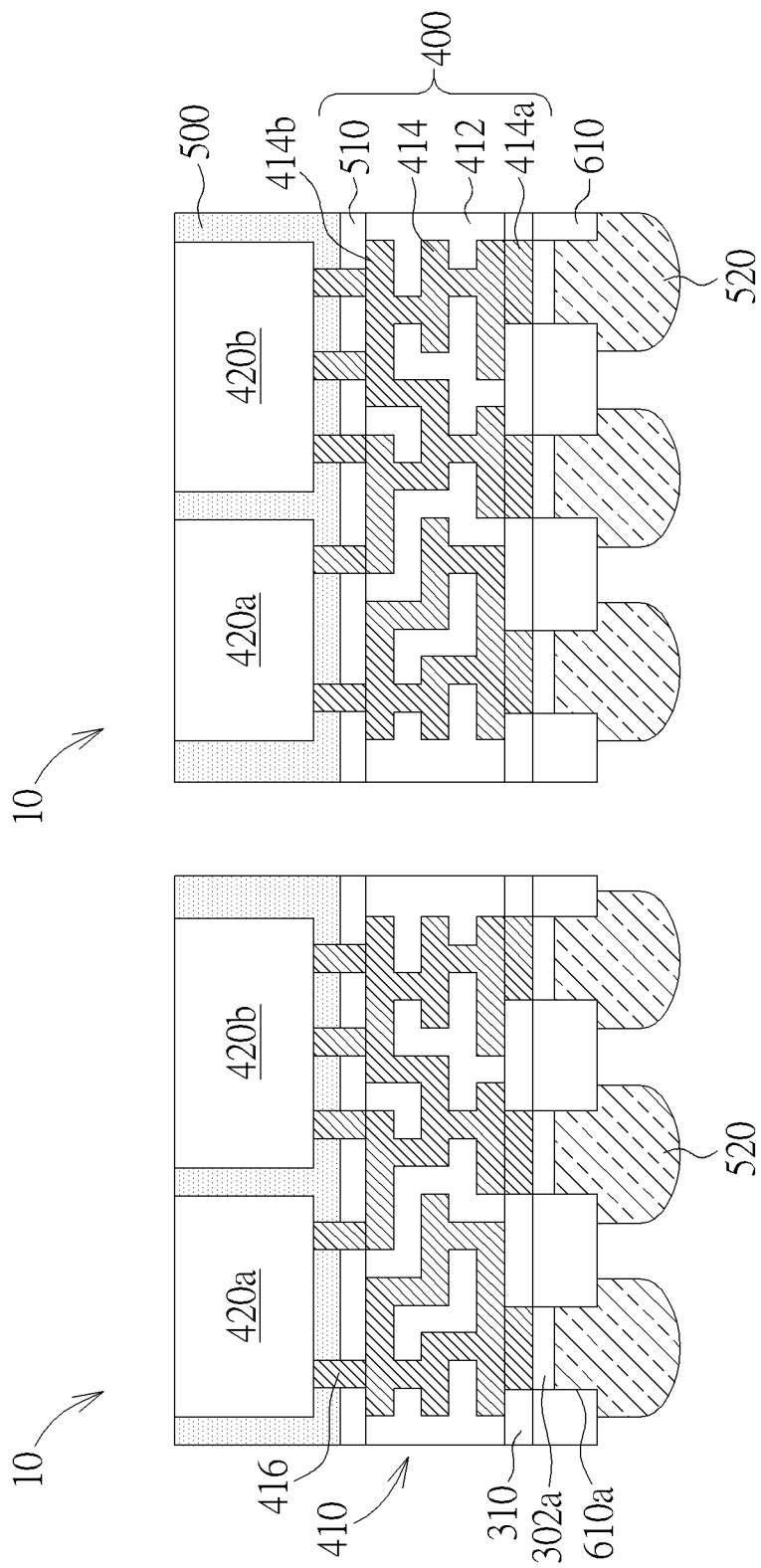

As shown in FIG. 11, a wafer dicing process is then performed to separate individual wafer level packages 10 from one another. It is understood that in some embodiments each wafer level package 10 may contain a single die although two dies are shown in each package in this figure.

It is one structural feature of the wafer level package 10 that the UBM layer 302a does not extend vertically to a sidewall of the opening 610a. Further, the ball pads 414a are formed in advance into the passivation layer 310 in an earlier stage of the fabrication of the wafer level package 10.

It is advantageous to use the present invention method because the molding compound 500 is formed after the formation of the UBM layer 302a and the solder bumps or solder balls 520. Therefore, the risk of known-good-die loss may be significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor package, comprising:
   providing a carrier having thereon a metal layer;
   forming a first passivation layer on the metal layer;
   forming a redistribution layer (RDL) layer on the first passivation layer and ball pads in the first passivation layer;
   forming a second passivation layer on the RDL layer;
   mounting at least one semiconductor die on the second passivation layer;
   molding the at least one semiconductor die with a molding compound;
   removing the carrier to expose a lower surface of the metal layer;
   patterning the metal layer into an under-bump metallization (UBM) layer on each of the ball pads;
   forming a solder mask on the first passivation layer; and
   forming solder bumps or solder balls on the ball pads.

2. The method for fabricating a semiconductor package according to claim 1, wherein after forming the second passivation layer on the RDL layer, the method further comprises:

forming a plurality of bumps in the second passivation layer, wherein the at least one semiconductor die is electrically connected to the RDL layer through the solder bumps.

3. The method for fabricating a semiconductor package according to claim 1, wherein the solder mask comprises a plurality of openings, and wherein each of the openings exposes the UBM layer.

4. The method for fabricating a semiconductor package according to claim 3, wherein each of the solder bumps or solder balls is in direct contact with the UBM layer.

5. The method for fabricating a semiconductor package according to claim 4, wherein the UBM layer is only disposed at a bottom of each of the plurality of openings.

6. The method for fabricating a semiconductor package according to claim 4, wherein the UBM layer does not extend to a vertical sidewall of each of the plurality of openings.

7. The method for fabricating a semiconductor package according to claim 1, wherein the UBM layer comprises nickel, gold, or copper.

8. The method for fabricating a semiconductor package according to claim 1, wherein the first passivation layer comprises polyimide, silicon nitride, or silicon oxide.

9. The method for fabricating a semiconductor package according to claim 1, wherein the second passivation layer comprises polyimide, silicon nitride, or silicon oxide.

* * * * *

UNITED STATES PATENT AND TRADEMARK OFFICE
CERTIFICATE OF CORRECTION

PATENT NO. : 9,704,790 B1
APPLICATION NO. : 15/069911
DATED : July 11, 2017
INVENTOR(S) : Tieh-Chiang Wu and Shing-Yih Shih Page 1 of 1

It is certified that error appears in the above-identified patent and that said Letters Patent is hereby corrected as shown below:

On the Title Page
In ITEM (57) ABSTRACT:
    Line 12,    change "mettalization (UBM)" to --metallization (UBM)--

In the Specification
Column 1,    Line 4,    change title "BACKGROUND OF THE INVENTION" to --TECHNICAL FIELD--
Column 1,    Line 11,    before subtitle "2. Description of the Prior Art" insert title --BACKGROUND--
Column 1,    Line 43,    change title "SUMMARY OF THE INVENTION" to --BRIEF SUMMARY--
Column 2,    Line 22,    change "apart of this" to --a part of this--
Column 3,    Line 48,    change "(C2 W)" to --(C2W)--

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*